(12) United States Patent
Park et al.

(10) Patent No.: US 7,839,085 B2
(45) Date of Patent: Nov. 23, 2010

(54) ORGANIC ELECTROLUMINESCENT DISPLAY DEVICE AND METHOD OF FABRICATING THE SAME

(75) Inventors: Kyung-Min Park, Gumi-si (KR); Seok-Jong Lee, Gumi-si (KR); Jae-Hee Park, Daegu (KR); Sang-ho Yu, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 484 days.

(21) Appl. No.: 11/639,316

(22) Filed: Dec. 15, 2006

(65) Prior Publication Data

US 2008/0012484 A1 Jan. 17, 2008

(30) Foreign Application Priority Data

Jun. 29, 2006 (KR) .................. 10-2006-0059348

(51) Int. Cl.
*H01J 1/62* (2006.01)
*H01J 9/00* (2006.01)
*H01L 27/14* (2006.01)

(52) U.S. Cl. .................. 313/509; 313/503; 313/505; 315/169.3; 445/24; 257/72

(58) Field of Classification Search .................. 313/509
See application file for complete search history.

(56) References Cited

U.S. PATENT DOCUMENTS 6,046,543 A 4/2000 Bulovic et al.
6,366,017 B1* 4/2002 Antoniadis et al. .......... 313/506
2003/0116772 A1 6/2003 Yamazaki et al.
2003/0173564 A1 9/2003 Ko et al.
2005/0098207 A1* 5/2005 Matsumoto et al. ......... 313/506
2005/0140306 A1* 6/2005 Park ........................ 315/169.3
2005/0212449 A1* 9/2005 Nanno et al. ............. 315/169.3

FOREIGN PATENT DOCUMENTS

| CN | 1245581 | 2/2000 |
|----|---------|--------|
| CN | 1623117 | 6/2005 |
| JP | 2004-048036 | 2/2004 |
| JP | 2005-175248 | 6/2005 |

* cited by examiner

*Primary Examiner*—Nimeshkumar D Patel
*Assistant Examiner*—Jacob Stern
(74) *Attorney, Agent, or Firm*—McKenna Long & Aldridge LLP

(57) ABSTRACT

An organic electroluminescent display (OELD) device includes: first and second substrates facing each other; a plurality of gate lines, a plurality of data lines and a plurality of power lines on the first substrate, the gate and data lines crossing each other to define a plurality of pixel regions; a switching element and a driving element connected to each other in each pixel region; a first electrode connected to the driving element; an organic luminescent layer on the first electrode, the organic luminescent layer including a buffer layer as an uppermost layer; and a second electrode of a transparent conductive material on the organic luminescent layer.

17 Claims, 16 Drawing Sheets

US 7,839,085 B2

ORGANIC ELECTROLUMINESCENT DISPLAY DEVICE AND METHOD OF FABRICATING THE SAME

The present application claims the benefit of Korean Patent Application No. 2006-0059348 filed in Korea on Jun. 29, 2006, which is hereby incorporated by reference for all purposes as if fully set forth herein.

BACKGROUND OF THE INVENTION

1. Field of the Invention

The present invention relates to an organic electroluminescent display (OELD) device, and more particularly, to a top emission type OELD device with a high luminance and method for fabricating the same.

2. Discussion of the Related Art

In general, organic electroluminescent display (OELD) devices emit light by injecting electrons from a cathode and holes from an anode into an emission layer, combining the electrons with the holes, generating excitons, and transforming the excitons of an excited state to a ground state. Unlike liquid crystal display (LCD) devices, OELD devices do not require an additional light source and therefore have the advantages of slimness and lightweight.

Since OELD devices have excellent characteristics, such as low power consumption, high luminance, fast response time, lightweight and so on, OELD devices can be applied to various electronic products, such as mobile phones, PDAs, camcorders, plam PCs, and so on. Moreover, due to their simple fabricating process, the fabrication costs of OELD devices are low as compared with LCD devices.

The OELD devices are divided into a passive matrix type and an active matrix type according to the driving method thereof. The passive matrix type OELD devices have a simple structure and a simple fabricating process. However, the passive matrix type OELD devices have disadvantages of high power consumption and low quality images. On the other hand, the active matrix type OELD devices have advantages of high emission efficiency and high quality images.

FIG. 1 is a cross-sectional view illustrating an active matrix type OELD device according to the related art.

Referring to FIG. 1, the OELD device 10 includes first and second substrates 12 and 28 facing each other. The first substrate 12 is transparent and flexible. The first substrate 12 has an array element 14 including a plurality of thin film transistors (TFTs) T and an organic electroluminescent diode E including a first electrode 16, an organic luminescent layer 18 and a second electrode 20. The organic luminescent layer 18 in each pixel region P includes one of red, green and blue color materials.

The second substrate 28 includes a moisture absorbent 22 of a powder type. The moisture absorbent 22 removes moisture inside the OELD device. The moisture absorbent 22 is in a concave portion of the second substrate 28 and is sealed by a taping 25. The first and second substrates 12 and 28 are attached to each other with a seal pattern 26.

In the OELD device, because the first electrode 16 is formed of a transparent material, the light emitted from the organic luminescent layer 18 travels toward the first substrate 12. Accordingly, it is referred to as a bottom emission type OELD device.

FIG. 2 is a circuit diagram of an OELD device according to the related art.

Referring to FIG. 2, gate and data lines 42 and 44 are formed on a substrate 32. The gate and data lines 42 and 44 cross each other and a switching element Ts is formed near the crossing portion of the gate and data lines 42 and 44. The switching element Ts includes a gate electrode 46, a source electrode 56 and a drain electrode 60. The gate electrode 46 is connected to the gate line 42. The source electrode 56 separated from the drain electrode 60 is connected to the data line 44.

A driving element Td is electrically connected to the switching element Ts. The driving element Td of a p-type TFT includes a gate electrode 68, a source electrode 66 and a drain electrode 63. The gate electrode 68 of the driving element Td is connected to the switching element Ts. A storage capacitor Cst is formed between the source and gate electrodes 66 and 68 of the driving element Td. The drain electrode 63 of the driving element Td is connected to the first electrode 16 (of FIG. 1) of the organic electroluminescent diode E. The source electrode 66 of the driving element Td is connected to a power line 55.

When a gate signal from the gate line 42 is supplied to the gate electrode 46 of the switching element Ts, a data signal from the data line 44 is supplied to the gate electrode 68 of the driving element Td through the switching element Ts. Then, the organic electroluminescent diode E is driven by the driving element Td such that the organic electroluminescent diode E emits light. Because the storage capacitor Cst maintains a voltage level of the gate electrode 68 of the driving element Td, even if the switching element Ts is turned off, the organic electroluminescent diode E can continuously emit light for a predetermined period of time.

The switching element Ts and the driving element Td include a semiconductor layer of one of amorphous silicon and polycrystalline silicon. When the semiconductor layer is formed of amorphous silicon, the switching element Ts and the driving element Td can be easily fabricated.

FIG. 3 is a plan view illustrating an array element of an active matrix type OELD device according to the related art and FIG. 4 is a cross-sectional view taken along the line IV-IV of FIG. 3.

Referring to FIGS. 3 and 4, the active matrix type OELD device includes a switching element Ts, a driving element Td and a storage capacitor Cst on a substrate 32. Each pixel of the OELD device may include more than one pair of the switching element Ts and the driving element Td.

A gate line 42 and a data line 44 are formed on the substrate 32 with a gate insulating layer interposed therebetween. A pixel region P is defined by the crossing between the gate and data lines 42 and 44.

The switching element Ts includes a gate electrode 46, an active layer 50 and source and drain electrodes 56 and 60. The gate electrode 46 of the switching element Ts is connected to the gate line 42, and the source electrode 56 of the switching element Ts is connected to the data line 44. The drain electrode 60 of the switching element Ts is connected to a gate electrode 68 of the driving element Td through a gate contact hole 64.

The driving element Td includes the gate electrode 68, an active layer 62 and source and drain electrodes 66 and 63. The source electrode 66 of the driving element Td is connected to a power line 55 through a power line contact hole 58. The drain electrode 63 of the driving element Td is connected to a first electrode 36 through a drain contact hole 65. The storage capacitor Cst includes the silicon pattern 35 as a first storage electrode, the power line 55 as a second storage electrode and a dielectric layer therebetween.

As illustrated in FIG. 4, an organic electroluminescent diode E includes the first electrode 36, an organic luminescent layer 38 and a second electrode 40. The first electrode 36 contacts the drain electrode 63 of the driving element Td through the drain contact hole 65, and the organic luminescent layer 38 is interposed between the first and second electrodes 36 and 40. The first and second electrodes 36 and 40 function as anode and cathode, respectively.

FIG. 5 is a cross-sectional view illustrating an organic electroluminescent diode according to the related art.

Referring to FIG. 5, the organic electroluminescent diode E formed on a substrate 32 includes a first electrode 36, an organic luminescent layer 38 and a second electrode 40. Although not shown, the substrate 32 includes an array element including the driving element Td (of FIG. 4). The first electrode 36 is connected to the driving element Td (of FIG. 4). The first and second electrode 36 and 40 function as anode and cathode, respectively. The organic luminescent layer 38 includes a hole injection layer (HIL) 38a, a hole transporting layer (HTL) 38b, an emitting material layer (EML) 38c, an electron transporting layer (ETL) 38d and an electron injection layer (EIL) 38e. The HTL 38b and the ETL 38d serve to improve emitting efficiency, and the HIL 38a and EIL 38e serve to reduce energy barrier in injecting electrons and holes.

The second electrode 40 functioning as cathode is formed of a low work function material, such as calcium (Ca), aluminum (Al), magnesium (Mg), silver (Ag) and lithium (Li), and the first electrode 36 functioning as anode is formed of a transparent conductive material such as indium-tin-oxide (ITO).

A sputtering process is generally used to form an ITO layer. However, it is difficult to deposit an ITO layer on the organic luminescent layer 38 because of damage on the organic luminescent layer 38 caused by the sputtering process. Accordingly, the OELD device according to the related art is the bottom emission type in which the first electrode 36 of ITO functioning as an anode is formed under the organic luminescent layer 38. However, the bottom emission type has disadvantages of low luminance and low aperture ratio. Moreover, because the first electrode 36 of ITO functioning as an anode is directly connected to the driving element Td, a p-type polycrystalline TFT should be used for the driving element Td, thereby complicating the fabrication process of the OELD device.

SUMMARY OF THE INVENTION

Accordingly, the present invention is directed to an organic electroluminescent display (OELD) device and method for fabricating the same that substantially obviate one or more of the problems due to limitations and disadvantages of the related art.

An advantage of the present invention is to provide an OELD device with a high luminance.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display (OELD) device includes: first and second substrates facing each other; a plurality of gate lines, a plurality of data lines and a plurality of power lines on the first substrate, the gate and data lines crossing each other to define a plurality of pixel regions; a switching element and a driving element connected to each other in each pixel region; a first electrode connected to the driving element; an organic luminescent layer on the first electrode, the organic luminescent layer including a buffer layer as an uppermost layer; and a second electrode of a transparent conductive material on the organic luminescent layer.

In another aspect of the present invention, a method of fabricating an OELD device includes: forming a switching element and a driving element on a first substrate, the switching and driving elements connected to each other in a pixel region; forming a first electrode connected to the driving element; forming an organic luminescent layer on the first electrode, the organic luminescent layer including a buffer layer as an uppermost layer; forming a second electrode of a transparent conductive material on the buffer layer; and attaching the first substrate to a second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 1:
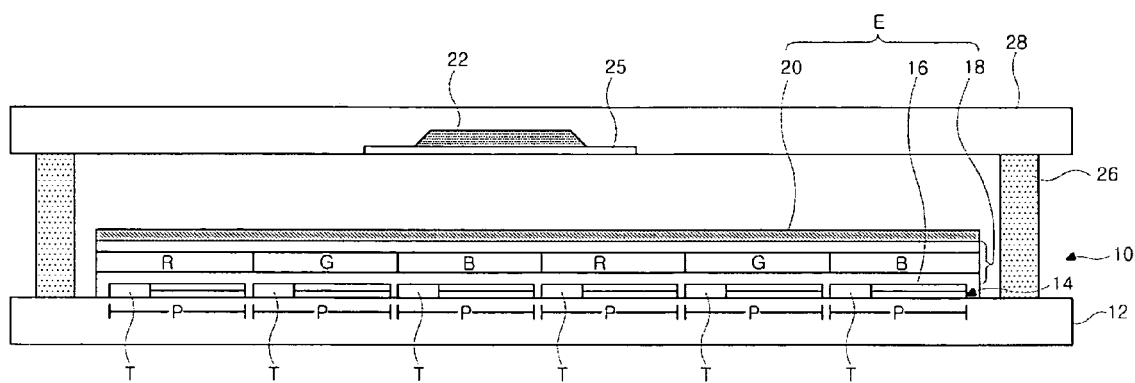
FIG. 1 is a cross-sectional view illustrating an active matrix type OELD device according to the related art.
Figure 2:
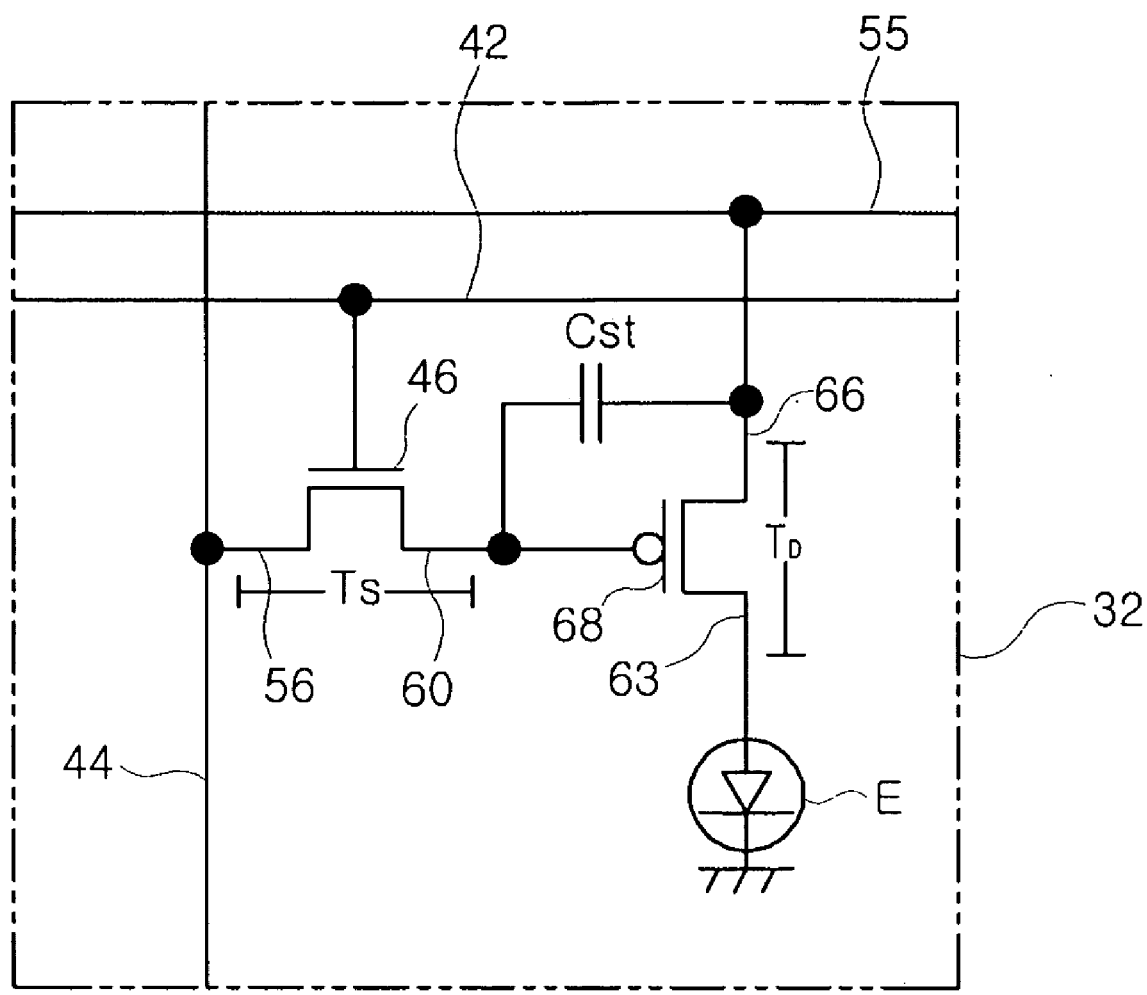
FIG. 2 is a circuit diagram of an OELD device according to the related art.
Figure 3:
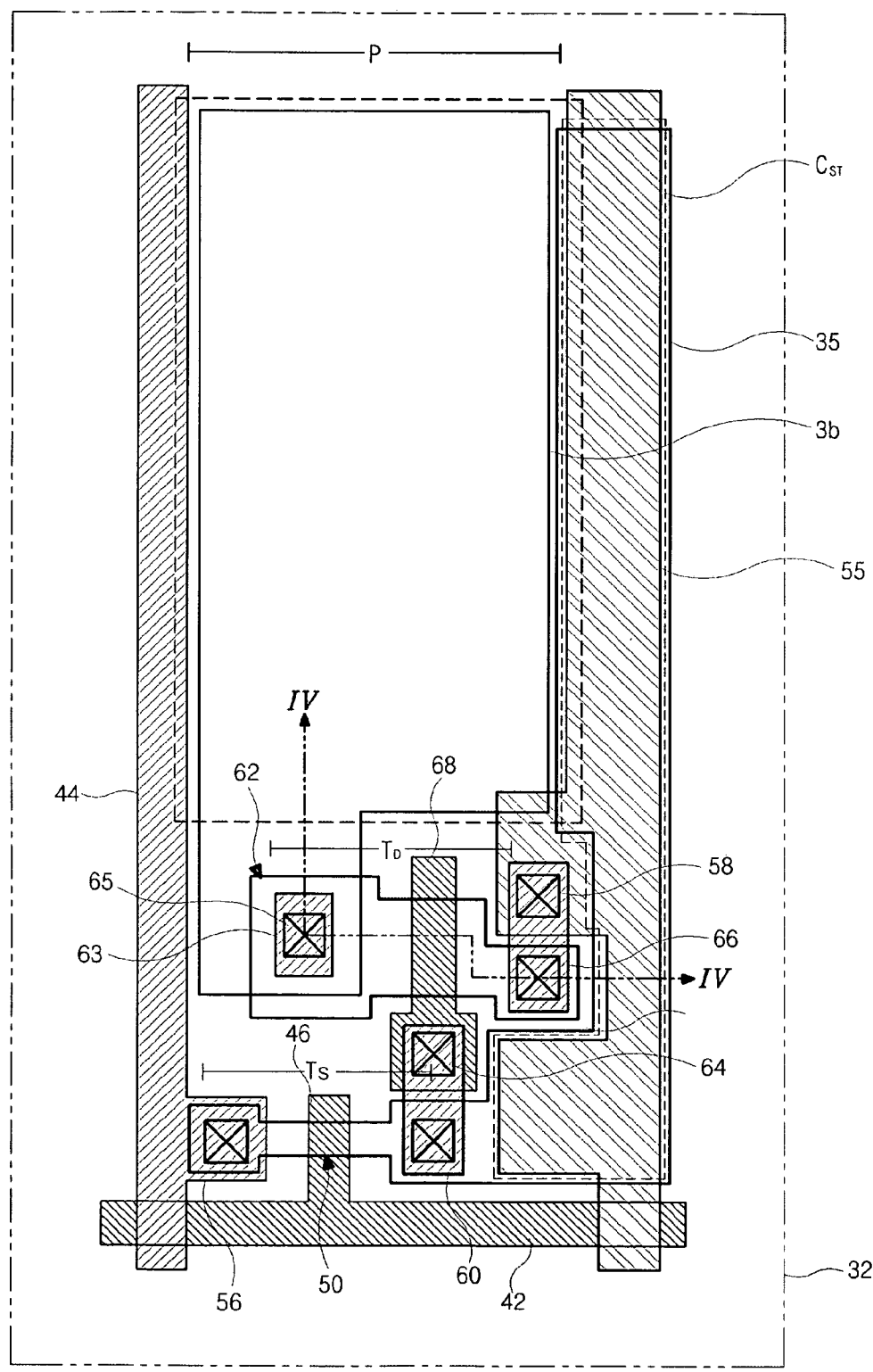
FIG. 3 is a schematic plan view illustrating an array element of an active matrix type OELD device according to the related art.
Figure 4:
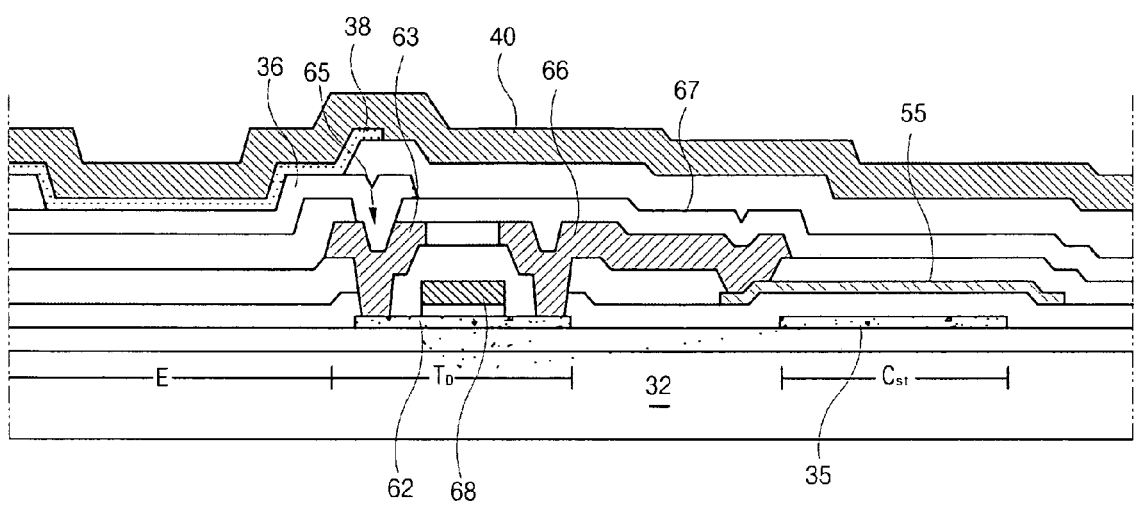
FIG. 4 is a cross-sectional view taken along the line IV-IV of FIG. 3.
Figure 5:
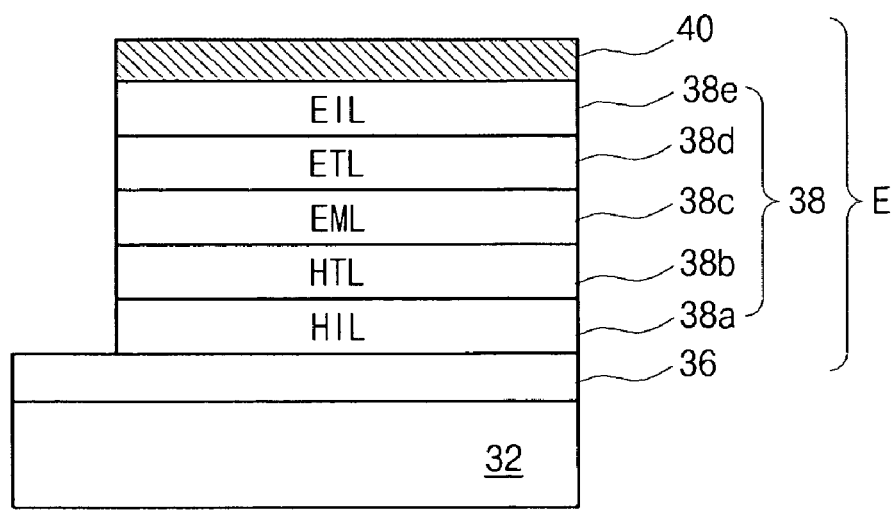
FIG. 5 is a cross-sectional view illustrating an organic electroluminescent diode according to the related art.
Figure 6:
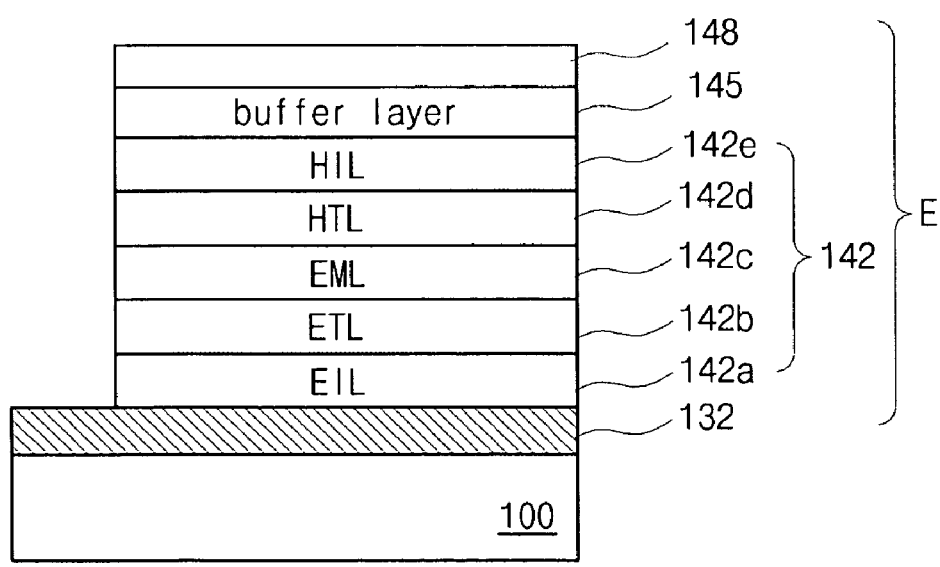
FIG. 6 is a cross-sectional view of an organic electroluminescent diode according to the first embodiment of the present invention.

FIG. 6 is a cross-sectional view of an organic electroluminescent diode according to the first embodiment of the present invention.

Referring to FIG. 6, the organic electroluminescent diode E is formed on a substrate 100. The organic electroluminescent diode E includes a first electrode 132, an organic luminescent layer 142 and a second electrode 148. The first electrode 132 and the second electrode 148 function as cathode and anode, respectively. Thus, the second electrode 148 has a work function greater than the first electrode 132. The second electrode 148 may be formed of a transparent conductive material such as indium-tin-oxide (ITO), indium-zinc-oxide (IZO), or the like. The organic luminescent layer 142 includes EIL 142a, ETL 142b, EML 142c, HTL 142d and HIL 142e. A buffer layer 145 is formed between the HIL 142e and the second electrode 148.

When the second electrode 148 is deposited by a sputtering process without the buffer layer 145, the HIL 142e suffers damage. In other words, the buffer layer 145 prevents the HIL 142e from being damaged during the deposition of the second electrode 148. The buffer layer 145 beneficially has a similar property to the HIL 142e and an impact resistance against deposition of the transparent conductive material. Accordingly, the buffer layer 145 may be formed of one of copper phthalocyanine (CuPC) and vanadium pentoxide ($V_2O_5$). From an OELD device perspective, CuPC has several advantages: a CuPC layer may be formed in a thin film and has a low threshold voltage, a high mobility and a high flexibility.

Figure 7:
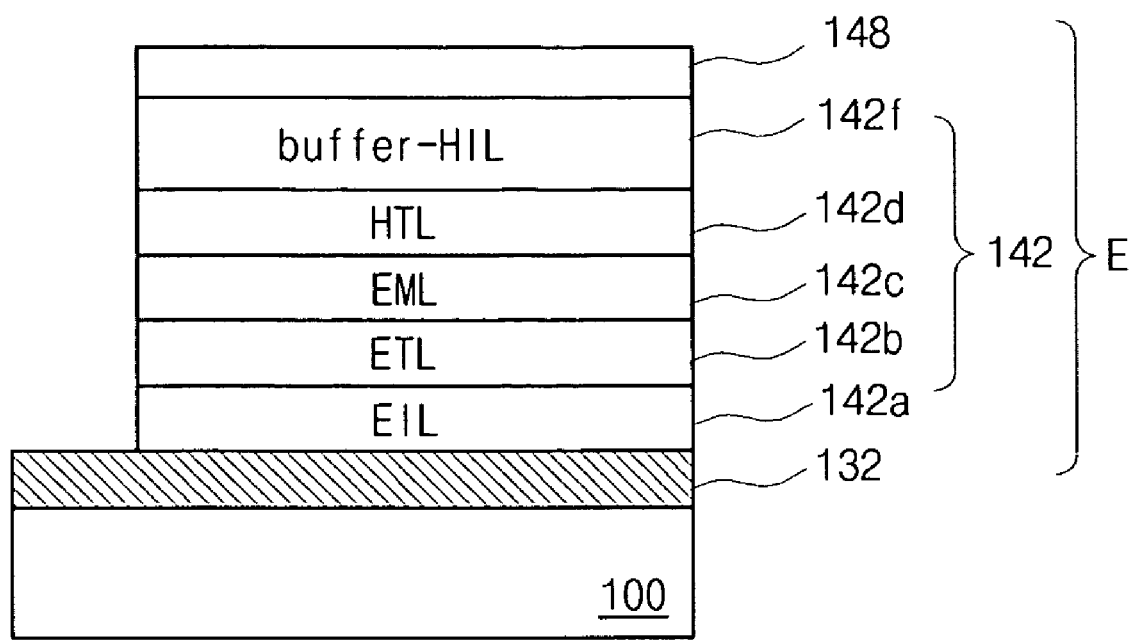
FIG. 7 is a cross-sectional view of an organic electroluminescent diode according to the second embodiment of the present invention.

FIG. 7 is a cross-sectional view of an organic electroluminescent diode according to the second embodiment of the present invention.

Referring to FIG. 7, a buffer-HIL layer 142f formed of one of the CuPC and the $V_2O_5$ is formed on the HTL 142d. The buffer-HIL layer 142f serves both functions of the HIL 142e layer (of FIG. 6) and the buffer layer 145 (of FIG. 6). Unlike the first exemplary embodiment that requires two layers, a second electrode 148 can be formed on the organic electroluminescent diode E without an additional buffer layer.

As described above, the second electrode 148 is formed of a transparent conductive material, such as ITO, IZO, or the like, and the first electrode 132 is formed of a metallic material, such as Ca, Al, Mg, Ag, Li, or the like. Because the second electrode 148 formed on the organic electroluminescent diode E is transparent, the light emitted from the organic luminescent layer 142 travels upward. Accordingly, the OELD device is referred to as a top emission type. The top emission type OELD device has a high aperture ratio compared with the bottom emission type OELD device. Moreover, because the first electrode 132 is formed under the organic electroluminescent diode E and connected to the driving element (not shown) on the substrate 100, an n-type amorphous silicon TFT may be used for the driving element, thereby simplifying the fabrication process and reducing production costs.

Figure 8:
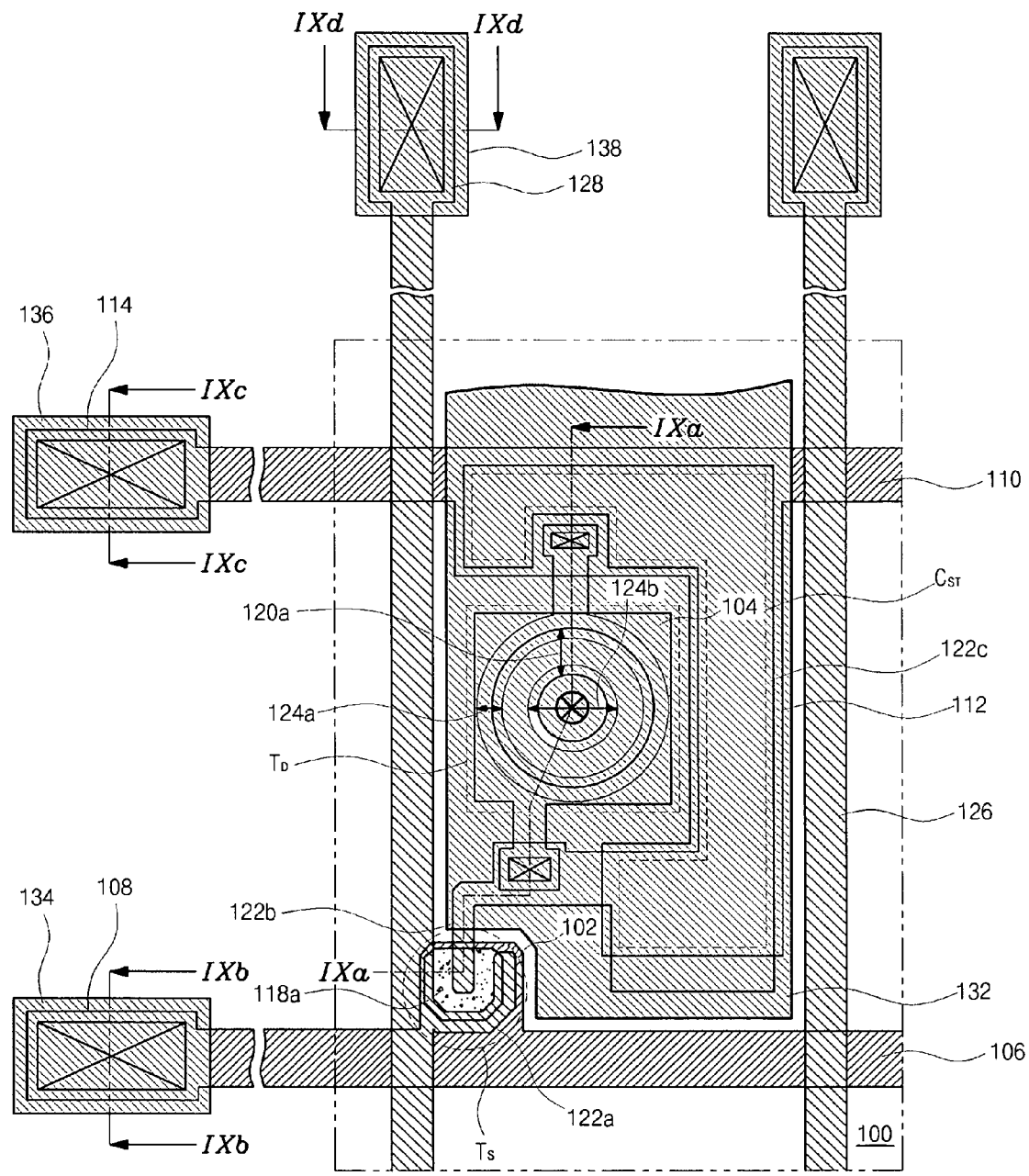
FIG. 8 is a schematic plan view illustrating an array substrate for an OELD device according to present invention.

FIG. 8 is a schematic plan view illustrating an array substrate for an OELD device according to present invention.

Referring to FIG. 8, the array substrate includes a gate line 106, a data line 126 and a power line 110 formed on a substrate 100. The gate line 106 and the data line 126 cross each other to define a plurality of pixel regions P on the substrate 100. The power line 110 is parallel to and separated from the gate line 106.

The switching element Ts and the driving element Td, which are connected to each other, are formed in each pixel region P. The switching and driving elements Ts and Td include n-type TFTs. The n-type TFT of the switching element Ts includes a gate electrode 102, an active layer 118a, an ohmic contact layer (not shown) and source and drain electrodes 122a and 122b. Similarly, the n-type TFT of the driving element Td includes a gate electrode 104, an active layer 120a, an ohmic contact layer (not shown) and source and drain electrodes 124a and 124b. The drain electrode 122b of the switching element Ts is connected to the gate electrode 104 of the driving element Td. The gate electrode 102 of the switching element Ts is connected to the gate line 106 such that a gate signal is supplied to the gate electrode 102 of the switching element Ts though the gate line 106. The source electrode 122a of the switching element Ts is connected to the data line 126 such that a data signal is supplied to the source electrode 122a of the switching element Ts through the data line 126.

A gate pad 108 is formed at an end of the gate line 106, and a gate pad electrode 134 contacts the gate pad 108. Similarly, a data pad 128 is formed at an end of the data line 126, and a data pad electrode 138 contacts the data pad 128. A power pad 114 is formed at an end of the power line 110, and a power pad electrode 136 contacts the power pad 114.

A storage capacitor Cst includes a first storage electrode 112, a second storage electrode 122c and a dielectric layer (not shown) therebetween. The first storage electrode 112 extends from the power line 110, and the second storage electrode 122c extends from the drain electrode 122b of the switching element Ts.

The first electrode 132 of the organic electroluminescent diode E (of FIGS. 6 and 7) is formed on an entire surface of the pixel region P. The first electrode 132 is connected to the drain electrode 124b of the driving element Td. Although not shown in FIG. 8, the organic luminescent layer 142 (of FIGS. 6 and 7) and the second electrode 148 (of FIGS. 6 and 7) are formed on the first electrode 132. The first electrode 132, the organic luminescent layer 142 (of FIGS. 6 and 7) and the second electrode 148 (of FIGS. 6 and 7) constitute the organic electroluminescent diode E (of FIGS. 6 and 7).

The switching element Ts and the driving element Td include the n-type TFTs having the active layers 118a and 120a of amorphous silicon, respectively. The source electrodes 122a and 124a and the drain electrodes 122b and 124b may have a variety of shapes to improve driving properties of the switching and driving elements Ts and Td.

For example, as shown in FIG. 8, the source electrode 122a of the switching element Ts has a U-shape, and the drain electrode 122b of the switching element Ts have a bar shape. A part of the drain electrode 122b is formed inside the U-shape source electrode 122a and is separated from the U-shape source electrode 122a. The source and drain electrodes 124a and 124b of the driving element Td have one of a ring shape and a disc shape. The source electrode 124a has a disc shape, and the drain electrode 124b is in the source electrode 124a. When the source electrodes 122a and 124a and the drain electrodes 122b and 124b have the above-mentioned structures, the channel regions of the n-type TFTs, which are formed between the source electrode 122a and the drain electrode 122b and between the source electrode 124a and the drain electrode 124b, have a lesser length and a greater width than the channel region of the related art TFT. As a result, the characteristics of the switching and driving elements Ts and Td are improved.

FIGS. 9A to 9D are cross-sectional views taken along the lines IXa-IXa, IXb-IXb, IXc-IXc and IXd-IXd of FIG. 8.

Figure 9A:
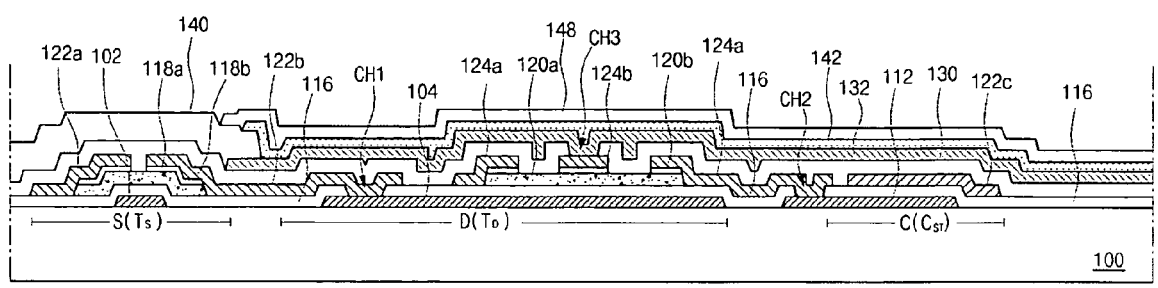
FIGS. 9A to 9D are cross-sectional views taken along the lines IXa-IXa, IXb-IXb, IXc-IXc and IXd-IXd of FIG. 8.

Referring to FIG. 9A, a switching region S, a driving region D and a storage region C are defined in the pixel region P on the substrate 100. Moreover, a gate region GR, a power region PR and a data region DR are formed at a periphery of the pixel region P. The switching and driving elements Ts and Td of an n-type TFT are formed in the switching and driving regions S and C, respectively. The storage capacitor Cst, which includes the first and second storage electrodes 112 and 122c and a gate insulating layer 116 therebetween, is formed in the storage region S. The first and second storage electrodes 112 and 122c extend from the power line 110 (of FIG. 8) and the drain electrode 122b of the switching element Ts, respectively. The gate insulating layer 116 functions as the dielectric layer of the storage capacitor Cst.

The first electrode 132 of an opaque metal material is formed over the driving element Td in each pixel region P. The first electrode 132 contacts the drain electrode 124b of the driving element Td though a third contact hole CH3. The organic luminescent layer 142 and the second electrode 148 are sequentially formed on the first electrode 132. Unlike the first electrode 132, the second electrode 148 may be formed on an entire surface of the first substrate 100. The first and second electrodes 132 and 148 function as cathode and anode, respectively. The first and second electrodes 132 and 148 and the organic luminescent layer 142 constitute the organic electroluminescent diode E (of FIGS. 6 and 7). The organic luminescent layer 142 has a multiple-layer structure as illustrated in FIGS. 6 and 7. A passivation layer 130 is formed between the first electrode 132 and the switching element Ts and between the first electrode 132 and the driving element Td.

The switching element Ts in the switching region S includes the gate electrode 102, the gate insulating layer 116, the active layer 118a, and the source and drain electrodes 122a and 122b. Similarly, the driving element Td in the driving region D includes the gate electrode 104, the gate insulating layer 116, the active layer 120a and the source and drain electrodes 124a and 124b. The drain electrode 122b of the switching element Ts is connected to the gate electrode 104 through a first contact hole CH1. The drain electrode 124b is connected to the power line 110 (of FIG. 8) through a second contact hole and the first storage electrode 112.

After forming the first electrode 132, a bank 140 surrounding the pixel region P is formed such that the organic luminescent layers 142 between adjacent pixel regions P do not contact each other.

Figure 9B:
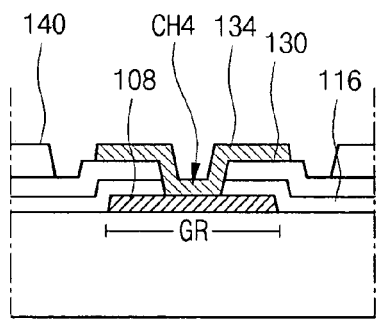

Referring to FIG. 9B, the gate pad 108 and the gate insulating layer 116, the passivation layer 130 and the gate pad electrode 134 are formed in the gate region GR. The gate pad 108 is formed at the end of the gate line 106 (of FIG. 8). The gate pad 108 is formed at the same time as the gate electrodes 102 and 104 (of FIG. 9A). The gate insulating layer 116 and the passivation layer 130 have a fourth contact hole CH4. The gate pad electrode 134 contacts the gate pad 108 through the fourth contact hole CH4.

Figure 9C:
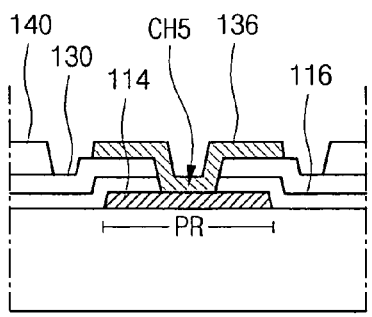

Referring to FIG. 9C, the power pad 114 and the gate insulating layer 116, the passivation layer 130 and the power pad electrode 136 are formed in the power region PR. The power pad 114 is formed at the end of the power line 110 (of FIG. 8). The power pad 114 is formed at the same time as the power line 110 (of FIG. 8). The gate insulating layer 116 and the passivation layer 130 have a fifth contact hole CH5. The power pad electrode 114 contacts the power pad 136 through the fifth contact hole CH5.

Figure 9D:
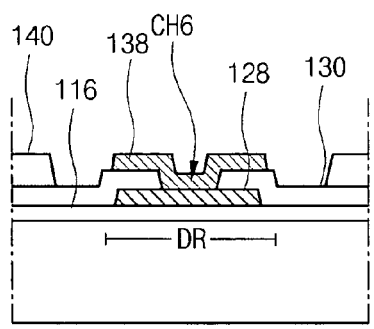
Figure 10A:
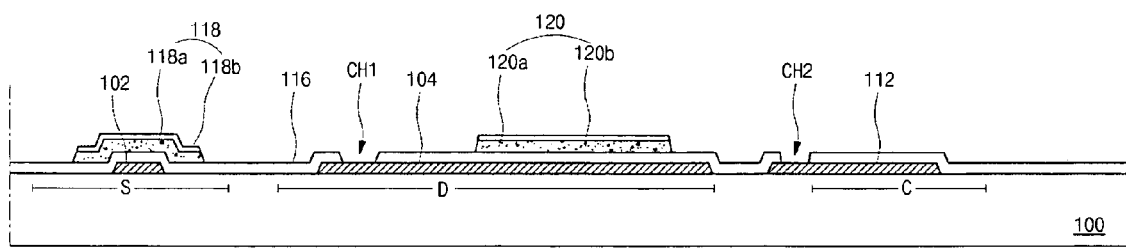
FIGS. 10A to 10E are cross-sectional views illustrating a fabricating process for the portion of the array substrate illustrated in FIG. 9A.
Figure 10B:
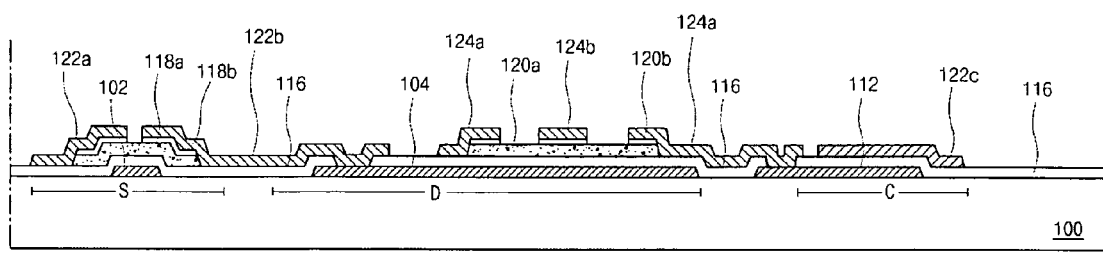
Figure 10C:
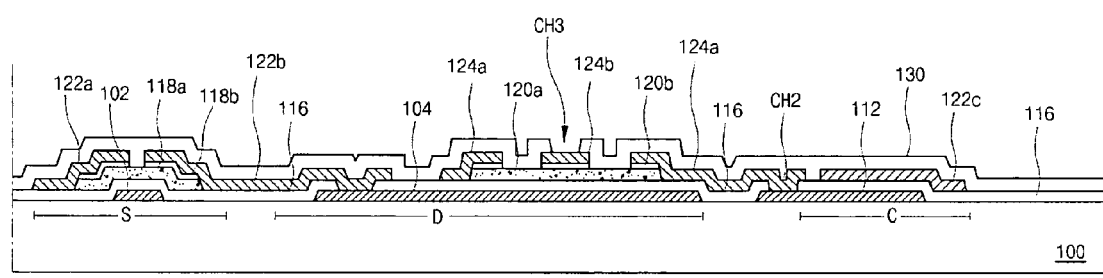
Figure 10D:
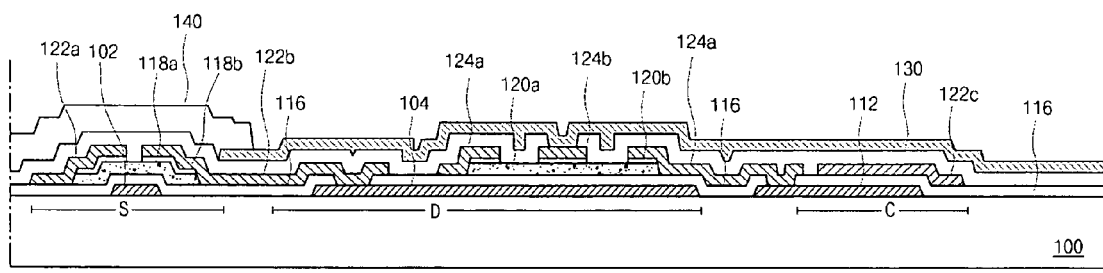
Figure 10E:
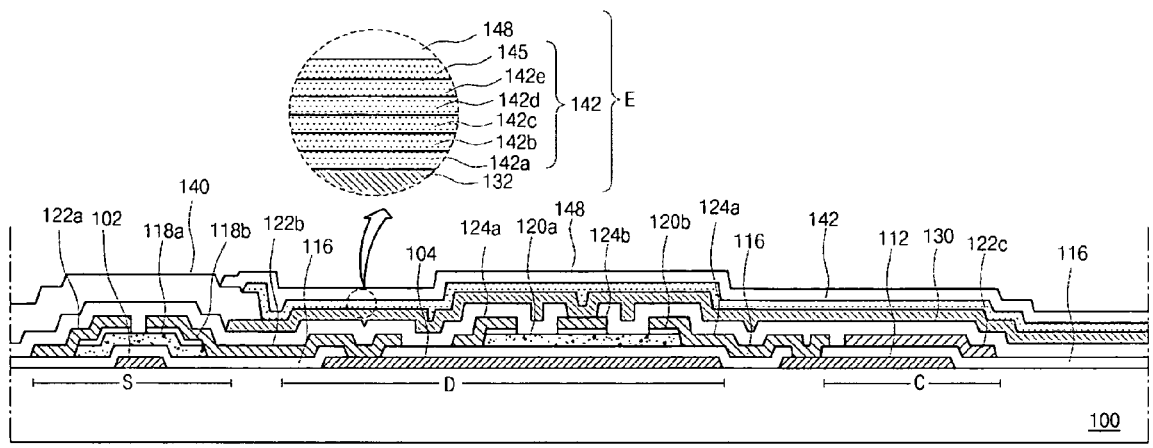
Figure 11A:
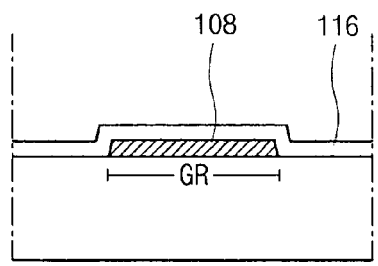
FIGS. 11A to 11E are cross-sectional views illustrating a fabricating process for the portion of the array substrate illustrated in FIG. 9B.
Figure 11B:
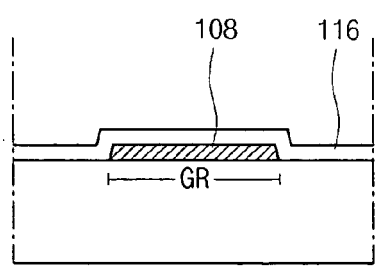
Figure 11C:
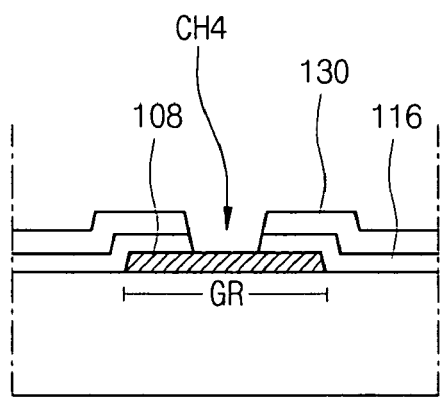
Figure 11D:
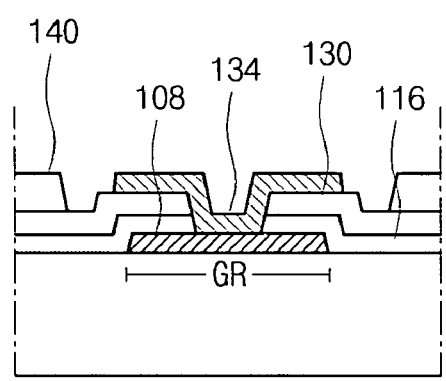
Figure 11E:
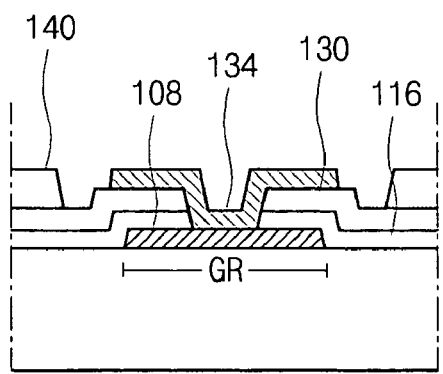
Figure 12A:
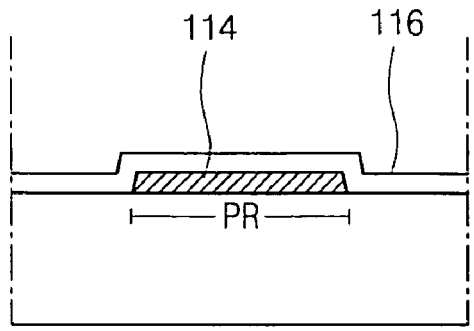
FIGS. 12A to 12E are cross-sectional views illustrating a fabricating process for the portion of the array substrate illustrated in FIG. 9C.
Figure 12B:
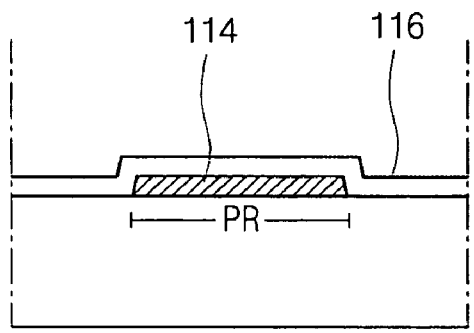
Figure 12C:
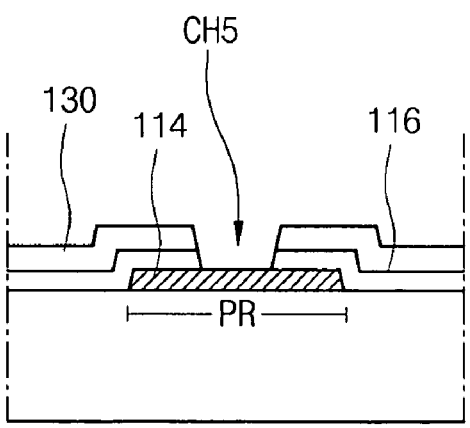
Figure 12D:
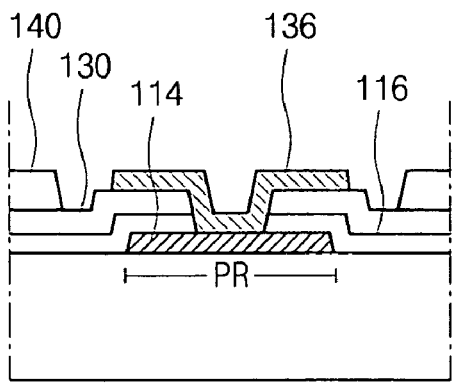
Figure 12E:
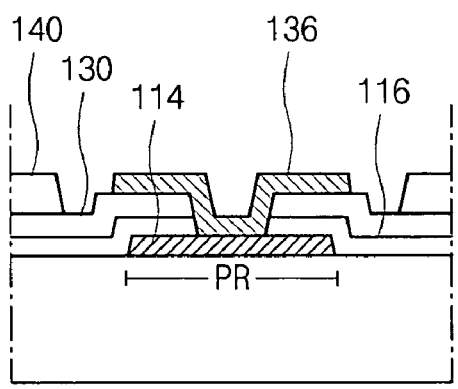
Figure 13A:
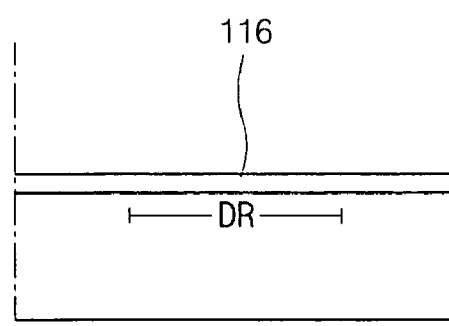
FIGS. 13A to 13E are cross-sectional views illustrating a fabricating process for the portion of the array substrate illustrated in FIG. 9D.
Figure 13B:
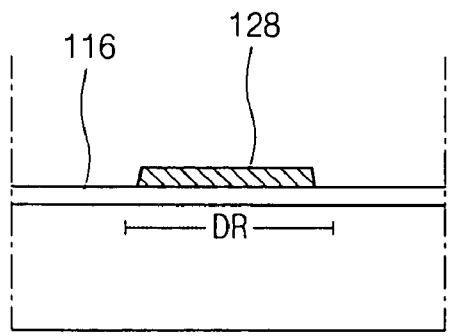
Figure 13C:
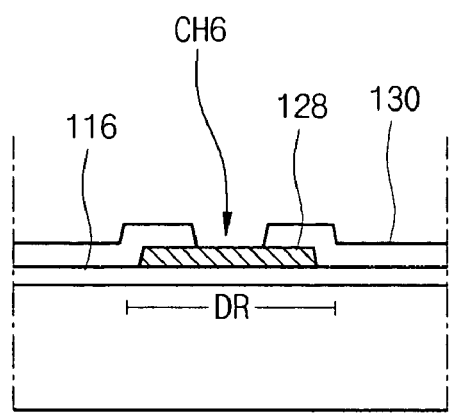
Figure 13D:
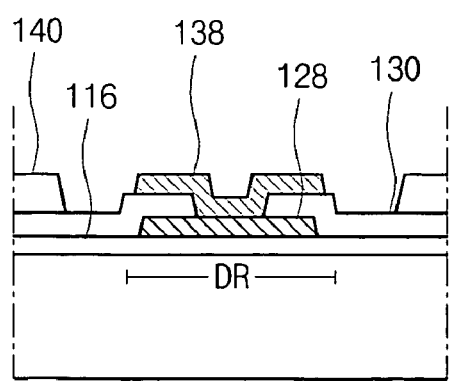
Figure 13E:
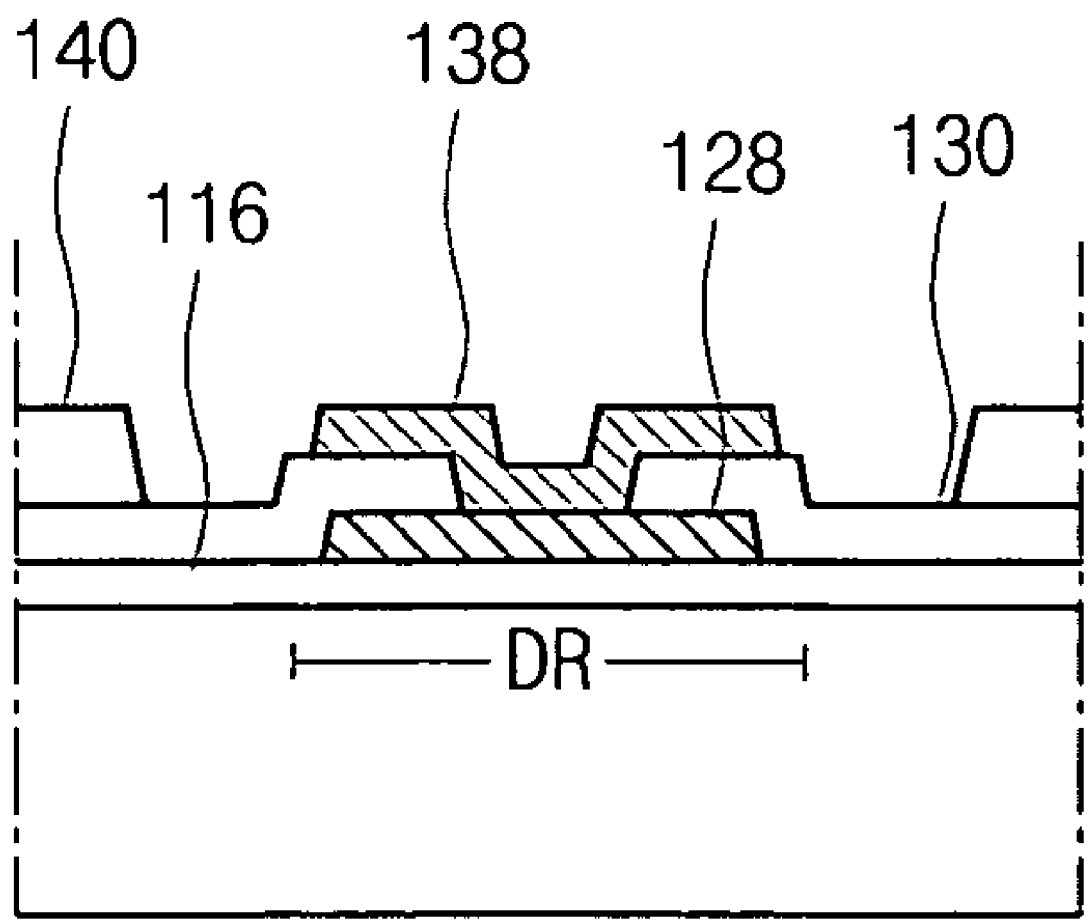

Referring to FIG. 9D, the data pad 128 and the gate insulating layer 116, the passivation layer 130 and the data pad electrode 138 are formed in the data region DR. The data pad 128 is formed at the end of the data line 126 (of FIG. 8). The data pad 128 is formed at the same time as the data line 126 (of FIG. 8). The gate insulating layer 116 and the passivation layer 130 have a sixth contact hole CH6. The data pad electrode 138 contacts the data pad 128 through the sixth contact hole CH6.

FIGS. 10A to 10E are cross-sectional views illustrating a fabricating process for the portion of the array substrate illustrated in FIG. 9A, and FIGS. 11A to 11E are cross-sectional views illustrating fabricating process for the portion of the array substrate illustrated in FIG. 9B. FIGS. 12A to 12E are cross-sectional views illustrating fabricating process for the portion of the array substrate illustrated in FIG. 9C, and FIGS. 13A to 13E are cross-sectional views illustrating fabricating process for the portion of the array substrate illustrated in FIG. 9D.

Referring to FIGS. 10A, 11A, 12A and 13A, the switching, driving and storage regions S, D and C in the pixel region P and the gate, power and data regions GR, PR and DR are defined on the substrate 100. The gate electrodes 102 and 104 in the switching and driving regions S and D, the first storage electrode 112 in the storage region S, the gate pad 108 in the gate region GR and the power pad 114 in the power region PR are formed on the substrate 100 by depositing and patterning a first conductive metallic material using a patterning mask (not shown). At the same time, the gate line 106 (of FIG. 8) and the power line 110 (of FIG. 8) are formed on the substrate 110. The gate pad 108 is located at the end of the gate line 106 (of FIG. 8), and the power pad 114 is located at the end of the power line 110 (of FIG. 8). The first storage electrode 112 extends from the power line 110 (of FIG. 8). The conductive metallic material may include at least Al, aluminum alloy (AlNd), chromium (Cr), Molybdenum (Mo), copper (Cu), Titanium (Ti), or the like.

Next, the gate insulating layer 116 is formed on the substrate 110 by depositing a first inorganic insulating material. The first inorganic insulating material may include silicon oxide ($SiO_2$), silicon nitride (SiNx), or the like.

Next, the semiconductor layer 118 including the active layer 118a and the ohmic contact layer 118b in the switching region S, and the semiconductor layer 120 including the active layer 120a and the ohmic contact layer 120b in the driving region D are formed on the gate insulating layer 116 by depositing and patterning an intrinsic amorphous silicon material and an impurity-doped amorphous silicon material. The semiconductor layers 118 and 120 correspond to the gate electrodes 102 and 104, respectively.

Next, the first and second contact holes CH1 and CH2 are formed through the gate insulating layer 116 by patterning the gate insulating layer 116. The first and second contact holes CH1 and CH2 expose the gate electrode 104 in the driving region D and the first storage electrode 112.

Referring to FIGS. 10B, 11B, 12B and 13B, after forming the first and second contact holes CH1 and CH2, the source electrodes 122a and 124a in the switching and driving regions S and D, the drain electrodes 122b and 124b in the switching and driving regions S and D, the data pad 128 in the data region D and the second storage electrode 122c in the storage region C are formed on the substrate 110 by depositing and patterning a second conductive material. At the same time, the data line 126 (of FIG. 8) is formed on the gate insulating layer 116. The second conductive material includes at least Al, aluminum alloy (AlNd), chromium (Cr), Molybdenum (Mo), copper (Cu), Titanium (Ti), or the like. The source electrode 122a in the switching region S extends from the data line 126 (of FIG. 8). The source and drain electrodes 122a and 122b in the switching region S are separated from each other, and the source and drain electrodes 124a and 124b in the driving region D are separated from each other. The second storage electrode 122c extends from the drain electrode 122b in the switching region S. The drain electrode 122b in the switching region S contacts the gate electrode 104 in the driving region D through the first contact hole CH1 (of FIG. 10A). The drain electrode 124b in the driving region DR contacts the first storage electrode 112 through the second contact hole CH2 (of FIG. 10A).

Next, channel regions are defined by removing the ohmic contact layer 118b between the source and drain electrodes 122a and 122b in the switching region S and the ohmic contact layer 120b between the source and drain electrodes 124a and 124b in the driving region D. The channel regions expose the active layers 118a and 120a. In this case, to decrease the length of the channel regions or increase the width of the channel regions, the source electrodes 122a and 124a may have a U-shape or a ring shape, and the drain electrodes 122b and 124b may have a bar shape or a disc shape. The drain electrodes 122b and 124b are separated from the source electrodes 122a and 122b.

Referring to FIGS. 10C, 11C, 12C and 13C, the passivation layer 130 is then formed on the substrate 110 by depositing a second inorganic insulating material. The second inorganic insulating material includes at least silicon oxide ($SiO_2$), silicon nitride (SiNx), or the like. Next, the third to sixth contact holes CH3, CH4, CH5 and CH6 are formed through the passivation layer 130 by patterning the passivation layer 130. The third and fourth contact holes CH3 and CH4 expose the drain electrode 124b in the driving region D and the gate pad 108 in the gate region GR, respectively, and the fifth and sixth contact holes CH5 and CH5 expose the power pad 114 in the power region PR and the data pad 128 in the data region DR, respectively.

Referring to FIGS. 10D, 11D, 12D and 13D, the first electrode 132, the gate pad electrode 134, the power pad electrode 136 and the data pad electrode 138 are then formed on the passivation layer 130 by depositing and patterning a metallic material, such as Ca, Al, Mg, Ag, Li, or the like. The first electrode 132 and the gate pad electrode 134 contact the drain electrode 124b in the driving region D and the gate pad 108 through the third and fourth contact holes CH3 and CH4, respectively. The power pad electrode 136 and the data pad electrode 138 contact the power pad 114 and the data pad 128 through the fifth and sixth contact holes CH5 and CH6, respectively.

Next, the bank 140 is formed on the substrate 100 to surround the pixel regions P by depositing and patterning a third organic insulating material. The third organic insulating material includes at least benzocyclobutene (BCB), acrylate resin, or the like. Because the bank 140 surrounds the pixel region P, the first electrode 132 in the pixel region P, the gate pad electrode 134, the power pad electrode 136 and the data pad electrode 138 are exposed by the bank 140. The bank 140 prevent the organic luminescent layers 142 (of FIG. 9A) in adjacent pixel regions P from contacting each other.

Referring to FIGS. 10E, 11E, 12E and 13E, the organic luminescent layer 142 is then formed on the first electrode 132. The organic luminescent layer 142 has the EIL 142a, the ETL 142b, the EML 142c, the HTL 142d, the HIL 142e and the buffer layer 145. Alternatively, as illustrated in FIG. 7, the organic luminescent layer 142 may have the EIL 142a, the ETL 142b, the EML 142c, the HTL 142d, and the buffer-HIL 142f (of FIG. 7).

Next, the second electrode 148 is formed on the organic luminescent layer 142 by depositing and patterning a transparent conductive material. The transparent conductive material includes ITO, IZO, or the like. The first and second electrodes 132 and 148, and the organic luminescent layer 142 therebetween constitute the organic electroluminescent diode E.

The lower substrate of the OELD device having the array element and the organic electroluminescent diode is fabricated by the processes described above. A top emission type OELD device according to the present invention is completed by attaching the lower substrate and a upper substrate including a moisture absorbent using a seal pattern.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent display (OELD) device, comprising:

first and second substrates facing each other; a plurality of gate lines, a plurality of data lines and a plurality of power lines on the first substrate, the gate and data lines crossing each other to define a plurality of pixel regions, wherein each of the power lines is substantially parallel to each of the gate lines and formed at the same layer as the gate lines;

a switching element and a driving element connected to each other in each pixel region, each of the switching and driving elements including a gate electrode, a gate insulating layer on the gate electrode, a semiconductor layer on the gate insulating layer and corresponding to the gate electrode, a source electrode on the semiconductor layer, and a drain electrode on the semiconductor layer and spaced apart from the source electrode, wherein the source electrode of the driving element is disposed at the same layer as the data line and the drain electrode of the switching element;

a storage capacitor including a first storage electrode, the gate insulating layer on the first storage electrode and a second storage electrode on the gate insulating layer, the first storage electrode extending from the power line, the second storage electrode extending from the drain electrode of the switching element, wherein the gate insulating layer including a storage contact hole exposing a portion of the first storage electrode;

a first electrode connected to the drain electrode of the driving element;

an organic luminescent layer on the first electrode, the organic luminescent layer including a buffer layer as an uppermost layer; and a second electrode of a transparent conductive material on the organic luminescent layer, wherein the source electrode of the driving element contacts the portion of the first storage electrode through the storage contact hole and;

wherein the buffer layer includes one of CuPC and V205.

2. The device according to claim 1, wherein the organic luminescent layer further includes an electron injection layer on the first electrode, an electron transporting layer on the electron injection layer, an emitting material layer on the electron transporting layer and a hole transporting layer on the emitting material layer.

3. The device according to claim 1, wherein the organic luminescent layer includes an electron injection layer on the first electrode, an electron transporting layer on the electron injection layer, an emitting material layer on the electron transporting layer, a hole transporting layer on the emitting material layer and a hole injection layer on the hole transporting layer.

4. The device according to claim 1, wherein the drain electrode of the switching element is connected to the gate electrode of the driving element, and the first electrode is connected to the drain electrode of the driving element.

5. The device according to claim 1, wherein the transparent conductive material includes one of ITO and IZO.

6. The device according to claim 1, wherein a work function of the first electrode is lower than a work function of the second electrode.

7. The device according to claim 1, wherein the first electrode is formed of a conductive material including one of Ca, Al, Mg, Ag and Li.

8. The device according to claim 1, wherein the first electrode is formed in each pixel region, and the second electrode is formed on an entire surface of the first substrate.

9. The device according to claim 1, wherein the buffer layer functions as a hole injection layer.

10. The device according to claim 4, wherein the source electrode of one of the switching and driving elements includes one of a U-shape and a ring shape, and the drain electrode of one of the switching and driving elements includes one of a bar shape and a disc shape.

11. The device according to claim 4, further comprising:
a gate pad at an end of the gate line;
a data pad at an end of the data line; and
a power pad at an end of the power line.

12. The device according to claim 4, wherein the semiconductor layer includes amorphous silicon.

13. The device according to claim 11, wherein the gate line, the gate pad, the power line and the power pad are formed of a same layer and with a same material as one another.

14. A method of fabricating an OELD device, comprising:
forming a gate line, a first storage electrode and a power line on a first substrate, the power line substantially parallel to the gate line, the first storage electrode extending from the power line;
forming a second storage electrode, a switching element and a driving element on the first substrate, the switching and driving elements connected to each other in a pixel region, each of the switching and driving elements including a gate electrode, the gate insulating layer on the gate electrode, a semiconductor layer on the gate insulating layer and corresponding to the gate electrode, a source electrode on semiconductor layer, and a drain electrode on the semiconductor layer and spaced apart from the source electrode, the gate insulating layer covering the first storage electrode and including a storage contact hole exposing a portion of the first storage electrode;
forming a data line crossing the gate line to define the pixel region;
forming a first electrode connected to the drain electrode of the driving element;
forming an organic luminescent layer on the first electrode, the organic luminescent layer including a buffer layer as an uppermost layer;
forming a second electrode of a transparent conductive material on the buffer layer; and attaching the first substrate to a second substrate,
wherein the second storage electrode extends from the drain electrode of the switching element to be disposed on the gate insulating layer such that the first storage electrode, the gate insulating layer and the second storage electrode form a storage capacitor, wherein the source electrode of the driving element is disposed at the same layer as the data line and the drain electrode of the switching element, and wherein the source electrode of the driving element contacts the portion of the first storage electrode through the storage contact hole; and
wherein the buffer layer includes one of CuPC and V205.

15. The method according to claim 14, wherein forming the organic luminescent layer further comprises:
forming an electron injection layer on the first electrode;
forming an electron transporting layer on the electron injection layer;
forming an emitting material layer on the electron transporting layer; and
forming a hole transporting layer on the emitting material layer.

16. The method according to claim 15, wherein forming the organic luminescent layer further comprises forming a hole injection layer between the hole transporting layer and the buffer layer.

17. The device according to claim 15, wherein the buffer layer functions as a hole injection layer.

* * * * *